United States Patent
Murata et al.

(10) Patent No.: US 6,661,238 B2
(45) Date of Patent: Dec. 9, 2003

(54) ABNORMALITY DIAGNOSIS METHOD AND APPARATUS FOR SEPARABLE TRANSFORMER

(75) Inventors: Koichi Murata, Tokyo (JP); Yasunori Habiro, Tokyo (JP); Dongzhi Jin, Tokyo (JP); Fumihiko Abe, Tokyo (JP); Hajime Mochizuki, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/016,303

(22) Filed: Oct. 30, 2001

(65) Prior Publication Data

US 2002/0047714 A1 Apr. 25, 2002

Related U.S. Application Data (63) Continuation of application No. PCT/JP01/01776, filed on Mar. 7, 2001.

(30) Foreign Application Priority Data

Mar. 8, 2000  (JP) ........................................ 2000-063436
Sep. 20, 2000 (JP) ........................................ 2000-285891

(51) Int. Cl.$^7$ .............................................. C01R 31/06
(52) U.S. Cl. ....................................... 324/547; 324/509
(58) Field of Search ........................... 320/107; 324/502, 324/509, 547, 705; 336/DIG. 2

(56) References Cited

U.S. PATENT DOCUMENTS 4,973,912 A * 11/1990 Kaminski et al. ........... 324/652
5,621,326 A *  4/1997 Watanabe et al. ........... 324/502
6,133,741 A * 10/2000 Mattes et al. ................ 324/502

FOREIGN PATENT DOCUMENTS

| JP | 51-23015 | 2/1976 |
|---|---|---|
| JP | 10-227827 | 8/1998 |
| JP | WO 99/50858 | 10/1999 |
| JP | WO 01/67471 A1 | 9/2001 |

* cited by examiner

Primary Examiner—N. Le
Assistant Examiner—Walter Benson
(74) Attorney, Agent, or Firm—Knobbe, Martens, Olson & Bear (57) ABSTRACT

A diagnosis apparatus (20) mounted to a separable transformer includes an arithmetic control section (27) for inputting, through a differential amplifier (24), a signal smoothing circuit 25 and a voltage detecting section (26), a mutual induction signal generated in a primary coil (11) of the separable transformer when dc power from a dc power supply section (21) and an ac signal from an oscillator (22) are applied to a capacitor (C) which cooperates with the primary core to form a resonance circuit. The arithmetic control section determines the presence or absence of a wire breakage or short-circuit failure in a secondary-side closed circuit of the separable transformer by comparing a frequency characteristic of mutual induction signal, determined based on mutual induction signals successively supplied thereto while the frequency of the ac signal from the oscillator varies, with frequency characteristics for normal, wire breakage and short-circuit conditions stored beforehand in a storage section (28).

15 Claims, 6 Drawing Sheets

ABNORMALITY DIAGNOSIS METHOD AND APPARATUS FOR SEPARABLE TRANSFORMER

RELATED APPLICATION

This application is a continuation of, and incorporates by reference in its entirety, to International Application No. PCT/JP01/01776, filed Mar. 7, 2001, which designates the United States and which was published in the Japanese language, which in turn claims priority to Japanese Application No. 2000-63436, filed Mar. 8, 2000 and Japanese Application No. 2000-285891, filed Sep. 20, 2000.

TECHNICAL FIELD

The present invention relates to an abnormality diagnosis method and apparatus for a separable transformer, and more particularly, to an abnormality diagnosis method and apparatus for determining occurrence of short-circuit or wire breakage in a closed circuit including a coil of a separable transformer and a load connected thereto.

BACKGROUND ART

A separable transformer, comprising primary and secondary cores arranged for relative rotation and primary and secondary coils wound thereon so as to be electromagnetically coupled to each other, is suitable to transmit power or an electric signal between relatively rotatable members.

Figure 7:
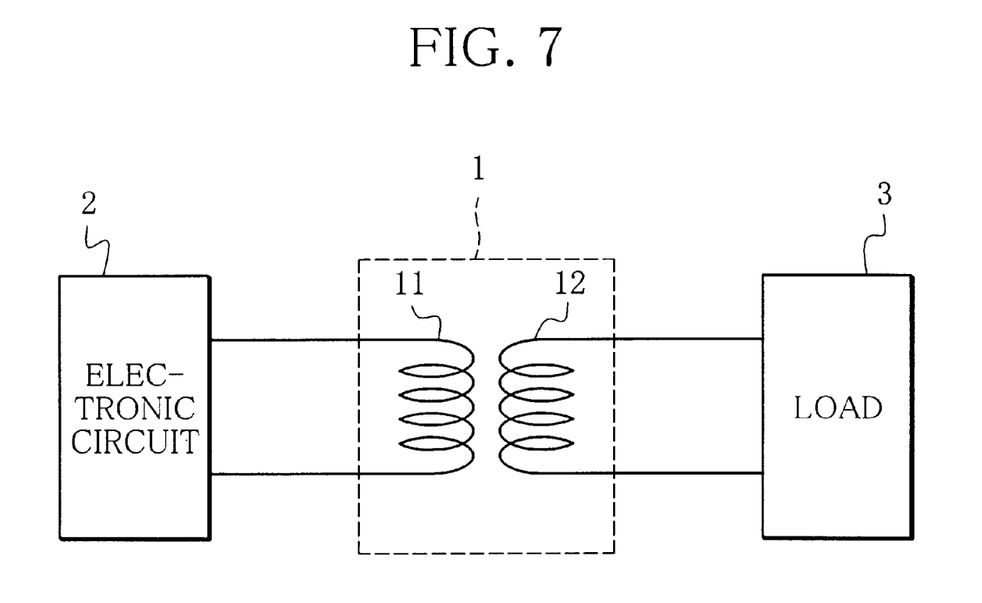
FIG. 7 is a schematic diagram showing a separable transformer used as a rotary connector, together with an electronic circuit and a load.

FIG. 7 shows a separable transformer 1 having a primary coil 11 and a secondary coil 12 connected to an electronic circuit 2 and a load 3, respectively. The separable transformer 1 serves to receive power or an electric signal from the electronic circuit 2 and transmit the same to the load 3. For example, the separable transformer 1 is used as a rotary connector for establishing, in non-contact manner, electrical connection between a stator fixed to a stationary member of a steering apparatus of an automobile and a rotor fixed to a steering wheel to be rotatable relative to the stator. In this case, the primary and secondary coils 11, 12 are fixed individually to the stator and the rotor, a sensor is connected to the input side of the electronic circuit 2, and a load 3 is constituted by, for example, a heating wire for an airbag received in the steering wheel. The electronic circuit 2 is adapted to supply the primary coil 11 of the separable transformer 1 with detonating power for inflating the airbag when it determines based on a signal from the sensor that the automobile has received large impact. The power is transmitted from the primary transformer 11 through the secondary transformer 12 to the heating wire 3, so that the heating wire 3 is heated to ignite a detonating agent, thereby inflating the airbag.

As understood from the above-described example, the separable transformer requires high operation reliability. On the other hand, a wire or an electric connector is used therein to establish the connection between the primary coil of the separable transformer and the electronic circuit and between the secondary coil and the load. Thus abnormalities can occur, such as connection failure at the electric connector and breakage of the wire.

For a rotary connector having a rotor and a stator electrically interconnected through a flat cable spirally arranged there between a diagnosis method is known, in which a connection failure at an electric connector and a wire breakage failure at the flat cable are determined based on a resistance value between electric connector terminals or between wires of the flat cable. By this method, an abnormality can be detected at an early stage so as to take necessary steps.

Unlike the flat-cable type rotary connector, the separable transformer, having electromagnetically intercoupled primary and secondary coils between which an ac component is transmitted but a dc component is not transmitted, makes it difficult to determine an occurrence of abnormality based on the resistance value. Specifically, with use of a diagnosis unit connected to the primary coil of the separable transformer for measuring the resistance value across the primary coil, it is impossible to detect an abnormality such as a wire breakage failure or a connection failure at an electric connector used to connect the separable transformer and the load. In the case of the separable transformer, therefore, it is difficult to determine an abnormality in electric connection of the separable transformer and the load by the conventional method.

DISCLOSURE OF THE INVENTION

The object of the present invention is to provide an abnormality diagnosis method and apparatus for diagnosing an abnormality in electric connection of a separable transformer and a load.

In order to attain the object, according to one aspect of the present invention, there is provided an abnormality diagnosis method for a separable transformer having primary and secondary coils thereof adapted to be electromagnetically coupled to each other and wound individually on primary and secondary cores that are arranged to face each other with a predetermined gap there between for relative rotation. The diagnosis method comprises the steps of (a) measuring mutual induction signals each generated in the primary coil of the separable transformer when an ac signal having a corresponding one of different frequencies is applied to the primary coil, (b) determining a frequency characteristic of mutual induction signal based on the mutual induction signals measured individually at the different frequencies of the ac signal in the step (a), and (c) determining an occurrence of a short-circuit or wire breakage failure in a closed circuit including the secondary coil of the separable transformer and a load connected thereto, based on the frequency characteristic of mutual induction signal determined in the step (b).

The diagnosis method of the present invention determines an abnormality in electric connection on the secondary side of the separable transformer based on mutual induction signals generated on the primary side to which an ac signal or ac power is applied, thereby making it possible to detect, at an early stage, an abnormality in electric connection on the secondary side that cannot be detected by the conventional method that is based on resistance value measurement.

The mutual impedance of the separable transformer as viewed from the primary coil has a different value between when electric connection in the secondary-side closed circuit of the separable transformer is normal and when an abnormality occurs therein, and hence the frequency characteristic of mutual induction signal observed when an abnormality occurs in the closed circuit is different from that for the normal closed circuit. Therefore, it is possible to determine an occurrence of abnormality based on the frequency characteristic of mutual induction signal (for example, a frequency characteristic parameter that characterizes the frequency characteristic), so that an abnormality in the closed circuit can be detected at an early stage and necessary steps can be taken, to improve the operation reliability of the separable transformer.

The separable transformer to which the diagnosis method of the present invention is applied is suitable for use as a rotary connector for electrically connecting a stationary member and a rotary member of a steering apparatus of an automobile, for example, contributing to safety driving of the automobile.

In the diagnosis method of the present invention, desirably, the mutual induction signals are measured while the frequency of the ac signal is varied. According to this desirable method varying the frequency of the ac signal discontinuously or continuously, the mutual induction signals are measured successively in step (a), and the frequency characteristic of mutual induction signal or of a smoothed signal level is determined properly based on the mutual induction signals or smoothed signals corresponding thereto.

Desirably, in step (c), the short-circuit or wire breakage failure in the closed circuit is determined by comparing the frequency characteristic of mutual induction signal determined in step (b) with frequency characteristics of mutual induction signal that are determined in advance individually for closed circuits having a normal electric connection, a wire breakage failure, and a short-circuit failure. With this desirable method, the abnormality determination based on the frequency characteristic of mutual induction signal can be made properly and quickly.

Desirably, the maximum signal level of a smoothed signal and a particular ac signal frequency corresponding thereto are measured by using each of testing separable transformers having the same structure as that of the separable transformer in question and having secondary-side closed circuits one of which is normal and others have wire breakage and short-circuit failures, respectively. The smoothed signal is obtained from a mutual induction signal generated when an ac signal is applied to each testing separable transformer. Based on these measured values, threshold values for predetermined ac signal frequencies, individually corresponding to the particular ac signal frequencies for the normal, wire breakage and short-circuit conditions, are determined in advance. The wire breakage or short-circuit failure in the closed circuit is determined by comparing actual signal levels at the predetermined ac signal frequencies with the threshold values, respectively.

The maximum signal level of smoothed signal and the particular ac signal frequency vary depending on the condition of electric connection in the secondary-side closed circuit of the separable transformer, and hence properly indicate the condition of electric connection in the closed circuit. With this desirable method carrying out the abnormality diagnosis based on the threshold values that are determined, using the testing separable transformers, from the maximum signal levels and the particular ac signal frequencies for the normal, wire breakage and short-circuit conditions, it is possible to properly determine an abnormality in electric connection in the secondary-side closed circuit of the separable transformer.

Desirably, an abnormality is determined based on an amount of change in signal level of the smoothed signal in a frequency region including the particular frequencies for the normal, wire breakage and short-circuit conditions.

The amount of change in the smoothed signal level properly indicates the connection condition in the secondary-side closed circuit of the separable transformer. With this desirable aspect making the abnormality determination based on the amount of change in the smoothed signal level, abnormalities in electric connection in the closed circuit can be determined properly.

According to another aspect of the present invention, there is provided an abnormality diagnosis apparatus for a separable transformer having primary and secondary coils thereof adapted to be electromagnetically coupled to each other and wound individually on primary and secondary cores that are arranged to face each other with a predetermined gap there_between for relative rotation.

The abnormality diagnosis apparatus comprises signal applying means for successively applying ac signals having different frequencies from one another to the primary coil of the separable transformer; signal detecting means for detecting mutual induction signals each generated in the primary coil when a corresponding one of the ac signals is applied to the primary coil, thereby detecting the mutual induction signals; and abnormality determining means for successively detecting frequencies of the ac signals and for determining an occurrence of a short-circuit or wire breakage failure in a closed circuit including the secondary coil of the separable transformer and a load connected thereto, based on a frequency characteristic of mutual induction signal determined from the frequencies of the ac signals and the mutual induction signals detected by said signal detecting means.

With this diagnosis apparatus adapted to determine an abnormality in electric connection on the secondary side of the separable transformer based on the mutual induction signals generated on the primary side when ac signal are applied to the primary side of the separable transformer, it is possible to detect, at an early stage, an abnormality in electric connection on the secondary side that cannot be detected by the conventional method which is based on resistance value measurement, whereby necessary steps can be taken. Thus, the separable transformer provided with the diagnosis apparatus of the present invention has an improved operation reliability.

In preferred diagnosis apparatuses of the present invention, the signal detecting means and the abnormality determining means are configured to achieve functions similar to those achieved by preferred diagnosis methods of the present invention, thereby properly diagnosing the presence or absence of an abnormality in the secondary-side closed circuit of the separable transformer.

BEST MODE OF CARRYING OUT THE INVENTION

Figure 1:
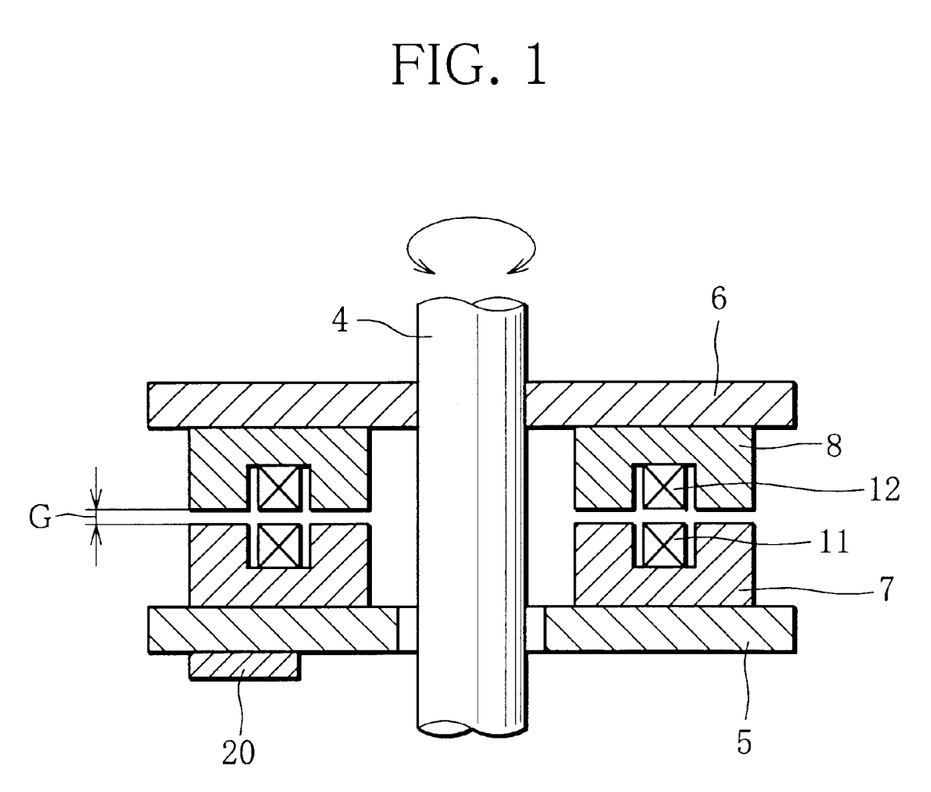
FIG. 1 is a sectional view of a rotary connector configured by a separable transformer provided with an abnormality diagnosis apparatus according to a first embodiment of the present invention.
Figure 2:
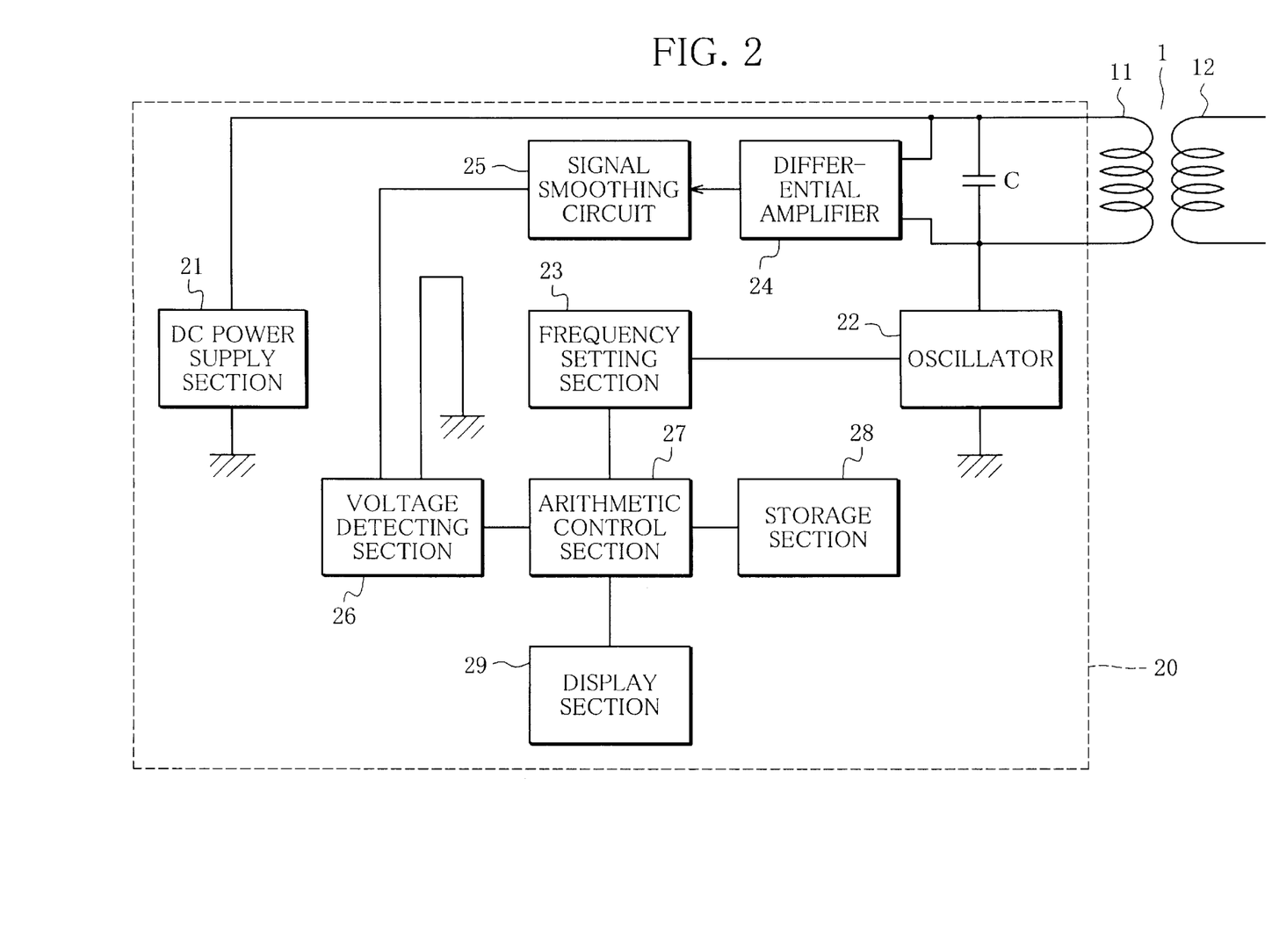
FIG. 2 is a block circuit diagram of the abnormality diagnosis apparatus shown in FIG. 1.

With reference to FIGS. 1 and 2, an abnormality diagnosis apparatus according to a first embodiment of the present invention will be described below.

The abnormality diagnosis apparatus of this embodiment is provided, for example, in a separable transformer constituting a main part of a rotary connector for a steering apparatus of an automobile, so as to diagnose an abnormality in a closed circuit including a secondary coil of the separable transformer and a load connected thereto.

As shown in FIG. 1, the rotary connector comprises a stator 5 fixed to a stationary member (not shown) of a steering apparatus and a rotor 6 fixed to a steering shaft (rotary member) 4 extending through the stator 5. The rotor 6 rotates relative to the stator 5 as a steering wheel (not shown) rotates. The rotary connector includes a separable transformer.

The separable transformer comprises primary and secondary cores 7, 8 of insulating magnetic material fixed individually to the stator 5 and rotor 6, and primary and secondary coils 11, 12 wound individually on the cores 7, 8. The primary and secondary cores 7, 8 are arranged coaxially with the steering shaft 4, and face each other with a gap G there between to be rotatable relative to each other. The primary and secondary coils 11, 12 can be electromagnetically intercoupled through the cores 7, 8.

Though illustration is partly omitted, a wire extending from the primary coil 11 has a distal end thereof connected to a male connector, for example, and a wire extending from a female connector connected with the male connector is connected to a control unit (corresponding to the electronic circuit 2 in FIG. 7), so that the primary coil 11 is electrically connected to the control unit 2. A wire extending from the secondary coil 12 is connected at its distal end to a male connector, for example, and another wire extending from the male connector is connected with an electric component accommodated in the steering wheel, such as for example, a heating wire of an airbag device (corresponding to the load 3 in FIG. 7). Thus, the secondary coil 12 is electrically connected with the heating wire 3. The secondary coil 12 and the heating wire 3 form a closed circuit.

In connection with control of operation of the airbag device, a sensor (not shown) for detecting the degree of impact which the automobile receives is connected to the input side of the control unit 3. The control unit 3 is configured to supply the primary coil 11 with detonating power for inflating the airbag when determining, based on an output signal of the sensor, that the automobile has received large impact. The power is transmitted from the primary coil 11 through the secondary coil 12 to the heating wire 3, so that the heating wire 2 is heated to ignite a detonating agent, thereby inflating the airbag (not shown) in a moment.

In FIG. 1, reference numeral 20 denotes an abnormality diagnosis apparatus of the present embodiment. The diagnosis apparatus 20 is attached to a lower surface of the stator 5.

As shown in FIG. 2, the diagnosis apparatus 20 comprises a capacitor C connected in parallel with the primary coil 11 and cooperating therewith to form a resonance circuit, a dc power supply section 21 connected to one end of the capacitor C, an oscillator 22 connected to another end of the capacitor C, and a frequency setting section 23 connected with the oscillator 22 for variably setting the oscillation frequency of the oscillator 22. In this arrangement, dc power is supplied from the dc power supply section 21 to the resonance circuit formed by the primary coil 11 and the capacitor C, and an ac signal is supplied from the oscillator 22 that is operable at the oscillation frequency set by the frequency setting section 23. In the resonance circuit, the dc power from the dc power supply section 21 is modulated by the ac signal from the oscillator 22, so that ac power having a frequency corresponding to the oscillation frequency is output from the resonance circuit. Since the oscillation frequency can be variably set, the ac power having a variable frequency is output from the circuit elements 21 to 23 and the resonance circuit. In a broad sense, the circuit elements 21 to 23 and the resonance circuit constitute signal applying means for successively applying ac signals having different frequencies to the primary coil 11. The ac power from the resonance circuit is transmitted through the primary and secondary coils 11, 12 to the load 3, to be consumed therein. Meanwhile, the dc power supply section 21 may be configured to generate dc power only over a certain period, for example, a period during which the automobile receives impact.

Referring to FIG. 2 again, the abnormality diagnosis apparatus 20 further comprises a differential amplifier 24 having two input terminals thereof connected individually to the opposite ends of the capacitor C. The differential amplifier 24 is configured to receive and amplify counter electromotive force generated across the primary coil 11 and supply a signal smoothing circuit 25 with a differential signal (mutual induction signal) representing the magnitude of the counter electromotive force. The signal smoothing circuit 25 is comprised of a low-pass filter, for example, and has the output side thereof connected to a voltage detecting section 26. The voltage detecting section 26 is arranged to detect the signal level (voltage value) of the differential signal smoothed by the signal smoothing circuit 25 and output the same to an arithmetic control section 27.

The arithmetic control section 27, connected with the frequency setting section 23, serves to control the timing of the oscillation frequency setting and of changing the setting in the frequency setting section 23, thereby variably controlling the oscillation frequency of the oscillator 22. The arithmetic control section 27, connected with the output side of the voltage detecting section 26, is configured to determine the maximum voltage value of the output signal supplied from the voltage detecting section 26 while the oscillation frequency is varied within a desired frequency region, and determine the oscillation frequency (a particular oscillation frequency (a particular ac signal frequency)) which is set by the frequency setting section 23 and at which the maximum voltage value is generated. In this connection, the arithmetic control section 27 includes an analog-to-digital converter, a digital arithmetic unit, and the like.

Further, the arithmetic control section 27 is designed to compare frequency characteristic data comprising the actually detected maximum voltage value and the particular oscillation frequency with frequency characteristic data stored in advance in a storage section 28, to thereby determine the presence or absence of abnormality in electrical connection in the secondary-side closed circuit of the separable transformer 1. In a broad sense, the arithmetic control section 27 and the storage section 28 constitute abnormality determining means for determining occurrence of an abnormality based on the frequency characteristic of the mutual induction signal (output of the differential amplifier 24).

When determining the occurrence of a short-circuit or wire breakage failure, the arithmetic control section 27 actuates a display section 29 to display data indicating that short-circuit or wire breakage has occurred.

Next, the principle of the abnormality determination in the present embodiment will be described.

The mutual impedance of the separable transformer 1 as viewed from the primary coil 11 varies from the normal value, if an abnormality occurs in electric connection in the secondary-side closed circuit of the separable transformer 1, such as breakage of the heating wire (load) 3, wire breakage in the secondary coil 12, short-circuit in the secondary coil 12, and short-circuit in the heating wire 3. With the change in the mutual impedance, the mutual induction signal (output of the differential amplifier 24) representing the magnitude of the counter electromotive force generated across the primary coil 11 varies, and accordingly, the voltage value (shown by symbol V in FIGS. 3 and 4) of the output signal of the signal smoothing circuit 25 that receives the mutual induction signal varies. The voltage value V also varies depending on the oscillation frequency (shown by symbol f in FIGS. 3 and 4) of the oscillator 22.

In view of the above, the diagnosis apparatus 22 of the present embodiment is designed to determine the maximum voltage value of the output signal of the signal smoothing circuit 25 and the corresponding oscillation frequency (particular oscillation frequency), as data representing the frequency characteristic of the mutual induction signal, and diagnose the presence or absence of abnormality in the secondary-side closed circuit based on the frequency characteristic data and the frequency data stored in the storage section 28.

To obtain the frequency characteristic data to be stored in the storage section 28, rotary connectors provided with separable transformers whose secondary-side closed circuits have normal electric connection, short-circuit failure, and wire breakage failure, respectively, are prepared artificially. These rotary connectors have the same structure as that shown in FIG. 1. By the arithmetic control section of the diagnosis apparatus attached to the separable transformer of each rotary connector, the maximum voltage value of the output signal from the voltage detecting section 26 and the particular oscillation frequency are obtained as frequency characteristic data. Meanwhile, data for the normal, wire breakage and short-circuit conditions may be obtained by using a single rotary connector.

Figure 3:
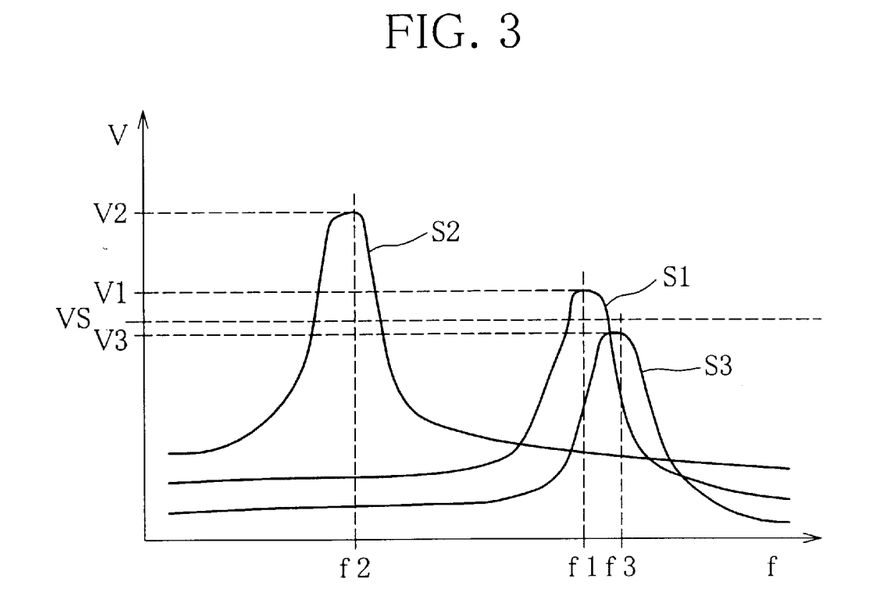
FIG. 3 is a graph showing a frequency characteristic of an output signal delivered from a signal smoothing circuit shown in FIG. 2 when a secondary-side closed circuit of the separable transformer is normal in electric connection, together with frequency characteristics for the closed circuits having wire breakage and short-circuit failures, respectively.

FIG. 3 shows the frequency characteristics S1, S2, S3 of the output signals from the signal smoothing circuits 25 of the rotary connectors having the normal connection, wire breakage failure and short-circuit failure, respectively.

As seen in FIG. 3, the maximum voltage value V2 of the output signal observed in the separable transformer whose the secondary-side closed circuit has a wire breakage failure is larger than the maximum voltage value V1 in the normal one, and the particular frequency f2 in the former is lower than the particular frequency f1 in the latter. The maximum voltage value V3 observed in the secondary-side closed circuit having a short-circuit failure is smaller than the maximum voltage value V1 in the normal one, and the particular frequency f3 in the former is higher than the particular frequency f1 in the latter.

As the frequency characteristic data S1, S2, S3 for the normal, wire breakage and short-circuit conditions, the maximum voltage values V1, V2, V3 and the particular frequencies f1, f2, f3 are stored in the storage section 28 before the shipment of the diagnosis apparatus 20.

Next, the operation of the diagnosis apparatus 20 of the present embodiment will be described.

When the rotary connector is in actual use, in order to diagnose the presence or absence of an abnormality in electric connection in the secondary-side closed circuit of the separable transformer 1, the abnormality diagnosis apparatus 20 mounted to the rotary connector causes the power supply section 21 to supply the primary coil 11 with a small dc current and causes the oscillator 22 to perform oscillation action. As a result, ac power having a frequency corresponding to the oscillation frequency of the oscillator 22 is applied to the primary coil 11 in which counter electromotive force generates. A differential signal (mutual induction signal) representing the magnitude of the counter electromotive force is supplied from the differential amplifier 24 to the signal smoothing circuit 25 and smoothed by the circuit 25. The voltage detecting section 26 detects the signal level (voltage value) of the smoothed differential signal.

The arithmetic control section 27 detects the voltage value of the output signal of the signal smoothing circuit 25 through the voltage detecting section 26, detects the oscillation frequency of the oscillator 22 from the frequency setting section 23 at that time, and stores therein the voltage value and the oscillation frequency. Then, the arithmetic control section 27 varies the oscillation frequency through the frequency setting section 23, and stores the voltage value of the output signal from the signal smoothing circuit 25 at the varied oscillation frequency, along with the varied oscillation frequency. In this way, the arithmetic control section 27 stores the voltage values of the output signal of the signal smoothing circuit 25 so as to correspond to the oscillation frequencies, while varying the oscillation frequency within a desired frequency region. In the case of the rotary connector for transmitting detonating power for inflating an airbag, the oscillation frequency is in the order of several kHz to hundreds kHz, and the voltage value of the output signal is tens mV to several V. Then, the arithmetic control section 27 determines the maximum voltage value of the stored voltage values of the output signal and the oscillation frequency (particular oscillation frequency) corresponding to the maximum voltage value.

Next, the arithmetic control section 27 successively compares the determined maximum voltage value and the particular oscillation frequency with the maximum voltage values V1, V2, V3 and the particular oscillation frequencies f1, f2, f3, read from the storage section 28, for normal, wire breakage, and short-circuit conditions, so as to determine which of the frequency characteristics S1, S2, S3 obtained in advance is most similar to the actual frequency characteristic, thereby determining whether the secondary-side closed circuit of the separable transformer 1 has normal electric connection, wire breakage failure, or short-circuit failure. The abnormality diagnosis is repeated at predetermined intervals.

As described above, on the basis of the recognition that the frequency characteristic of the output signal of the signal smoothing circuit 25 can be represented by the mutual impedance of the separable transformer 1 varying depending on the condition of electric connection in the secondary-side closed circuit of the separable transformer 1, the abnormality diagnosis apparatus 20 of the present embodiment is designed to properly and immediately determine, based on the frequency characteristic, the presence or absence of an abnormality in electric connection in the secondary-side closed circuit, so as to take appropriate measures at an early stage in operation and maintenance of an automobile.

The abnormality diagnosis may be carried out based on the waveforms S1, S2, S3 (FIG. 3) representing frequency characteristics, in their entirety, of the output signal of the signal smoothing circuit 25 although the abnormality diagnosis in the embodiment is made based on the maximum voltage values V1, V2, V3 of output signals and particular frequencies (oscillation frequencies of oscillators 22) f1, f2, f3 corresponding thereto, which as a whole characterize the frequency characteristics.

Although the abnormality diagnosis in the embodiment is based on the frequency characteristic of the output signal of the signal smoothing circuit 25 that represents the mutual impedance of the separable transformer 1, it may be based on the phase characteristic of the mutual induction signal representing the relation between voltage value and phase of the mutual induction signal, considering that the phase of the mutual induction signal generated across the primary coil 11 varies with the change in the mutual impedance. Specifically, the phase characteristics for the normal, wire breakage and short-circuit conditions are detected in advance, and the phase characteristic detected in the process of the abnormality diagnosis is compared with these phase characteristics successively.

In the following, an abnormality diagnosis apparatus 20 according to a first modification of the first embodiment will be described.

As compared with the first embodiment storing the storage section 28 in advance with the maximum voltage values V1, V2, V3 and the particular frequencies f1, f2, f3 for the cases where the secondary-side closed circuit of the separable transformer 1 is in the normal, wire breakage and short-circuit conditions, the present modification is different in that three threshold values VS1, VS2, VS3 of the voltage of the output signal of the signal smoothing circuit 25 are stored beforehand in the storage section 28 so as to correspond individually to the particular frequencies f1, f2, f3, to be served for the abnormality diagnosis. In the other points, this modification is the same as the first embodiment and hence explanations of those points will be omitted.

Figure 4:
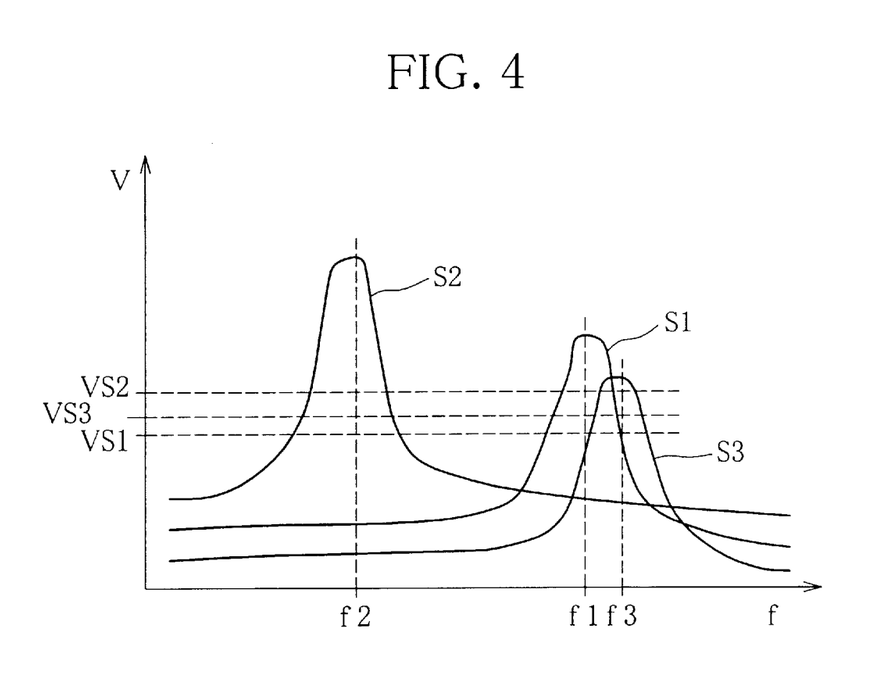
FIG. 4 is a graph explaining the setting of voltage threshold values for use in abnormality diagnosis based on frequency characteristic.

With reference to FIG. 4, the threshold values VS1, VS2, VS3 for use in this modification will be described below.

In this modification, assume that the maximum voltage value of the output signal of the signal smoothing circuit 25 and the particular frequency corresponding thereto take values of V1, V2, V3 and f1, f2, f3 when the secondary-side closed circuit of the separable transformer 1 is in the normal, wire breakage and short-circuit conditions, respectively, as in the first embodiment (FIG. 3). In other words, the frequency characteristics S1, S2, S3 in FIG. 4 are the same as those illustrated in FIG. 3.

As shown in FIG. 4, the threshold value VS1 is set to be smaller than the voltage value V at the frequency f1 in the frequency characteristic S1 for the normal condition and larger than the voltage values V at the frequency f1 in the frequency characteristics S2, S3 for the wire breakage and short-circuit conditions. The threshold value VS2 is set to be smaller than the voltage value V at the frequency f2 in the frequency characteristic S2 and larger than the voltage values V at the frequency f2 in the frequency characteristics S1, S3. The threshold value VS3 is set to be smaller than the voltage value V at the frequency f3 in the frequency characteristic S3 and larger than the voltage values V at the frequency f3 in the frequency characteristics S1, S2.

To set the threshold values VS1 to VS3, rotary connectors whose secondary-side closed circuits of the separable transformers have normal electric connection, short-circuit failure, and wire breakage failure, respectively, are prepared artificially. Then, the frequency characteristics S1 to S3 of the output signals of the voltage detecting sections 26 are detected, respectively, by the arithmetic control sections 27 of the diagnosis apparatuses attached to the separable transformers of the rotary connectors, and, based on the frequency characteristics S1 to S3, the threshold values VS1 to VS3 are set so as to meet the above-described requirements. The threshold values VS1, VS2, VS3 are stored in advance in the storage section 28 so as to correspond individually to the frequencies f1, f2, f3.

The abnormality diagnosis apparatus 20 of this modification operates in basically the same manner as the apparatus of the first embodiment, and hence explanations as to the operation common to the first embodiment will be omitted.

In the abnormality diagnosis, the arithmetic control section 27 of the diagnosis apparatus 20 actuates the oscillator 22 through the frequency setting section 23 to cause the oscillator 22 to make an oscillating action at the particular frequency f1, f2 or f3. It is known that variations in the particular frequencies f1, f2 and f3 that vary depending on the accuracy in assembling the separable transformer 1, temperature and the like fall within a certain range as long as the resistance value of the load is within a certain range.

In the abnormality diagnosis for the secondary-side closed circuit of the separable transformer 1, the arithmetic control section 27 detects the voltage value V of the output signal of the signal smoothing circuit 25 through the voltage detecting section 26 while actuating the oscillator 22 through the frequency setting section 23 to operate the oscillator 22 at the frequency f2, and then determines whether or not the voltage value V exceeds the threshold value VS2 read from the storage section 28. If the voltage value V at the frequency f2 exceeds the threshold value V52, the arithmetic control section 27 determines that the secondary closed circuit has a wire breakage failure and causes the display section 29 to display wire-breakage occurrence information.

If the voltage value V at the frequency f2 does not exceed the threshold value VS2, the arithmetic control section 27 detects the voltage value V of the output signal of the signal smoothing circuit 25 while causing the oscillator 22 to operate at the frequency f1, and determines whether or not the voltage value V exceeds the threshold value VS1. If the voltage value V exceeds the threshold value VS1, the secondary-side closed circuit is determined as being normal in electric connection.

In case that the voltage value V at the frequency f1 does not exceed the threshold value VS1, the arithmetic control section 27 detects the voltage value V while causing the oscillator 22 to operate at the frequency f3. If the voltage value V at the frequency f3 exceeds the threshold value VS3, it determines that a short-circuit failure occurs in the secondary closed circuit and causes the display section 29 to display short-circuit occurrence information. If the voltage value V at the frequency f3 does not exceed the threshold value VS3, it is determined that the diagnosis was not carried out normally, and the abnormality diagnosis is carried out again.

As described above, with this modification setting the threshold values VS1 to VS3 at the frequencies f1 to f3 in advance based on the frequency characteristics S1 to S3 for the cases where the secondary-side closed circuit of the separable transformer is in the normal, wire breakage and short-circuit conditions, respectively, it is possible to properly and quickly determine the presence or absence of abnormality in the secondary-side closed circuit in the abnormality diagnosis by comparing the voltage values V of the output signal of the signal smoothing circuit 25 at the frequencies f1 to f3 with the threshold values VS1 to VS3, respectively.

Next, an abnormality apparatus 20 according to a second modification of the first embodiment will be described.

As compared with the first modification performing the abnormality diagnosis based on the threshold values VS1 to VS3 for the voltage of the output signal of the signal smoothing circuit 25 at the frequencies f1 to f3, the second modification is different in that the abnormality diagnosis at the frequencies f1 and f3 is made using differential values of the voltage of the output signal of the signal smoothing circuit 25. In the other points, this modification is the same as the first modification, and hence explanations of those points will be omitted.

In case that the load for the secondary coil 12 of the separable transformer 1 is constituted by a heating wire for inflating an airbag, the resistance value of the heating wire is as small as several $\Omega$, and therefore, a small difference appears in the mutual impedance of the separable transformer 1 as viewed from the primary coil 11 between when the heating wire has a short-circuit failure and when it is normal. In other words, the frequency characteristic S1 of the output signal of the signal smoothing circuit 25 observed when the heating wire is normal is similar to the frequency characteristic S3 for the heating wire having a short-circuit failure, and there occurs a small difference between the peak voltages V1 and V3 and between the frequencies f1 and f3, posing a difficulty in setting the threshold values VS1 and VS3. Thus, it may be difficult to determine, based on the threshold values VS1 and VS3, whether the secondary-side closed circuit of the separable transformer 1 is normal or has a short-circuit failure.

In view of the above, the abnormality diagnosis apparatus of the second modification is designed to determine whether the secondary-side closed circuit of the separable transformer 1 has normal connection or a short-circuit failure, based on the differential values dV/df of the voltages V of the output signal from the signal smoothing circuit 25 respectively detected when the oscillator 22 operates at the oscillation frequencies f1 and f3.

The diagnosis apparatus 20 of this modification operates basically in the same way as the apparatus of the first modification. Explanations as to the operation common to the first modification will be omitted.

In the abnormality diagnosis for the secondary-side closed circuit of the separable transformer 1, the arithmetic control section 27 detects the voltage value V of the output signal of the signal smoothing circuit 25 while operating the oscillator 22 at the frequency f2. If the voltage value V exceeds the threshold value VS2, it determines that wire breakage occurs in the secondary-side closed circuit and causes the display section 29 to display wire-breakage occurrence information.

If the voltage value V at the frequency f2 does not exceed the threshold value VS2, the arithmetic control section 27 detects the voltage value V of the output signal from the signal smoothing circuit 25 twice or more while varying the oscillation frequency f of the oscillator 22 in a first frequency region where the frequency f1 is at the center, and calculates a first differential value dV/df of the voltage of the output signal by dividing the difference between the two voltage values V, successively detected, by the difference between the frequencies f at which the voltage values V are detected respectively. Next, the arithmetic control section 27 detects the voltage value V twice or more while varying the oscillation frequency f in a second frequency region having the frequency f3 at the center, and calculates a second differential value dV/df of the voltage of the output signal by dividing the difference between the two voltage values V, successively detected, by the difference between the frequencies f at which the voltage values V are detected. Each differential value represents an amount of change in the voltage value V per unit change of the frequency f. Meanwhile, in the case of detecting the voltage value V thrice or more in each frequency region so that two or more differential values are obtained, an average of these differential values, for instance, is calculated for subsequent use.

Next, the arithmetic control section 27 determines whether or not the first differential value dV/df in the first frequency region having the frequency f1 at the center is positive and at the same time the second differential value dV/df in the second frequency region having the frequency f3 at the center is approximately zero. As understood from FIGS. 3 and 4, if the first differential value is positive and the second differential value is approximately zero, the arithmetic control section 27 determines that short-circuit occurs in the secondary-side closed circuit of the separable transformer 1 because the frequency characteristic of the output signal of the signal smoothing circuit 25 is more similar to the frequency characteristic S3 than to the frequency characteristic S1, and causes the display section 29 to display short-circuit occurrence information.

If the occurrence of short-circuit is not determined, the arithmetic control section 27 further determines whether or not the first differential value is approximately zero and at the same time the second differential value is negative. If the result of the determination is affirmative, it is determined that the secondary-side closed circuit is normal because the frequency characteristic of the sent-out signal is more similar to the frequency characteristic S1 than to the frequency characteristic S3. If the secondary-side closed circuit is not determined as being normal, the abnormality diagnosis will be made again determining that the diagnosis has not been carried out normally.

As described above, the second modification properly determines whether the secondary-side closed circuit of the separable transformer 1 is normal or has a short-circuit failure based on the differential values of the output signal voltage of the signal smoothing circuit 25 at the frequencies f1, f3, thereby making a proper abnormality diagnosis even if the load for the separable transformer 1 has a small resistance value.

In the second modification, a wire breakage failure in the secondary-side closed circuit is determined when the voltage value of the output signal of the signal smoothing circuit exceeds the threshold value VS2. Alternatively, the presence or absence of the wire breakage in the secondary-side closed circuit may be determined based on differential values (amounts of change) of the output signal voltages at the frequency f2 and a frequency in the vicinity thereof. Specifically, an occurrence of wire breakage is determined when the differential value at the frequency near the frequency f2 is large in magnitude and positive or negative in sign and the same time the differential value at the frequency f2 is approximately zero.

Figure 5:
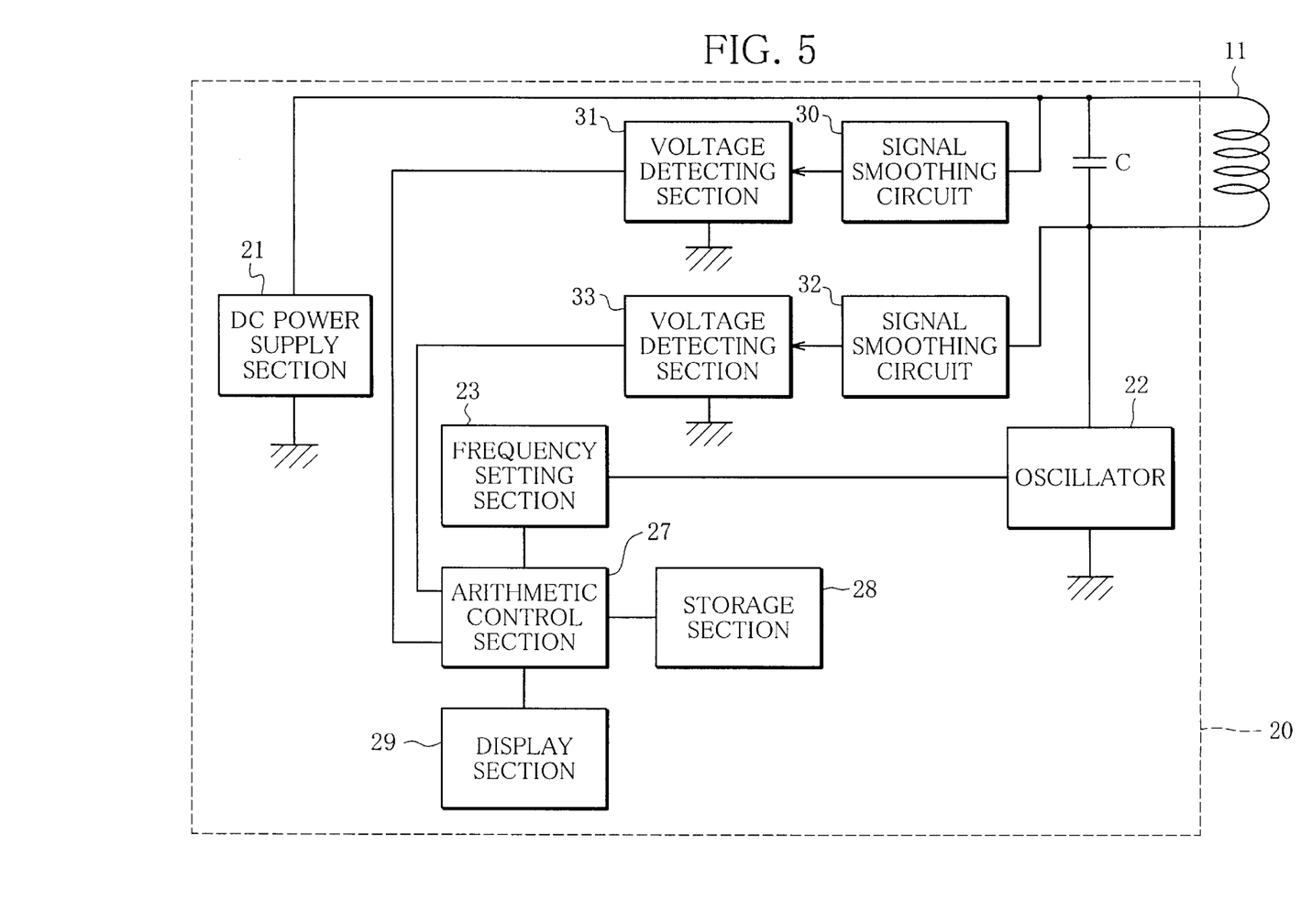
FIG. 5 is a block circuit diagram of an abnormality diagnosis apparatus according to a second embodiment of the present invention.

With reference to FIG. 5, an abnormality diagnosis apparatus according to a second embodiment of the present invention will be described.

In FIG. 5, those components of the diagnosis apparatus 20 of the present embodiment which are common to the first embodiment shown in FIG. 2 are denoted by the same reference numerals.

The abnormality diagnosis apparatus 20 of this embodiment is featured in that a reduction in cost is achieved by eliminating the differential amplifier 24 provided in the first embodiment. In place of the differential amplifier 24 and the signal smoothing circuit 25 in the first embodiment, first and second signal smoothing circuits 30, 32 and first and second voltage detecting sections 31, 33 are provided.

The input sides of the first and second signal smoothing circuits 30, 32 are connected individually to the opposite ends of a capacitor C which forms a resonance circuit in cooperation with the primary coil of the separable transformer 1. The output sides of the signal smoothing circuits 30, 32 are connected individually to the input sides of the voltage detecting sections 31, 33 whose output sides are connected to the arithmetic control section 27.

The first signal smoothing circuit 30 is designed to smooth a first voltage signal representing the magnitude of counter electromotive force generated between one end of the primary coil 11 and the earth, whereas the second signal smoothing circuit 32 serves to smooth a second voltage signal representing the magnitude of counter electromotive force generated between the other end of the primary coil 11 and the earth. The first and second voltage detecting sections 31, 33 are arranged to detect the signal levels of the output signals of the first and second signal smoothing circuits 30, 32, respectively, and transmit them to the arithmetic control section 27. The arithmetic control section 27 is arranged to determine, based on the output signals of the first and second voltage detecting sections 31, 33, the signal level (voltage value) of a differential signal representing the magnitude of the electromotive force generated across the primary coil 11. In the other points, the diagnosis apparatus 20 shown in FIG. 5 has the same structure as that of the first embodiment.

As in the first embodiment, in the abnormality diagnosis apparatus 20 of this embodiment, the arithmetic control section 27 detects voltage values of the differential signal so as to correspond to oscillation frequencies while causing the oscillation frequency of the oscillator 22 to vary in a desired frequency region, determines the maximum voltage value of the differential signal in the desired frequency region and a particular frequency corresponding thereto, and diagnoses the presence or absence in the secondary-side closed circuit of the separable transformer 1 by comparing the maximum voltage value and the particular frequency with the maximum voltage values and particular frequencies for the cases where the closed circuit of the separable transformer 1 is normal and has an abnormality.

With the second embodiment determining whether the secondary-side closed circuit is normal or has a wire breakage or short-circuit failure without using an expensive differential amplifier, it is possible to reduce manufacturing costs of the abnormality diagnosis apparatus and attain advantages similar to those achieved by the first embodiment.

Figure 6:
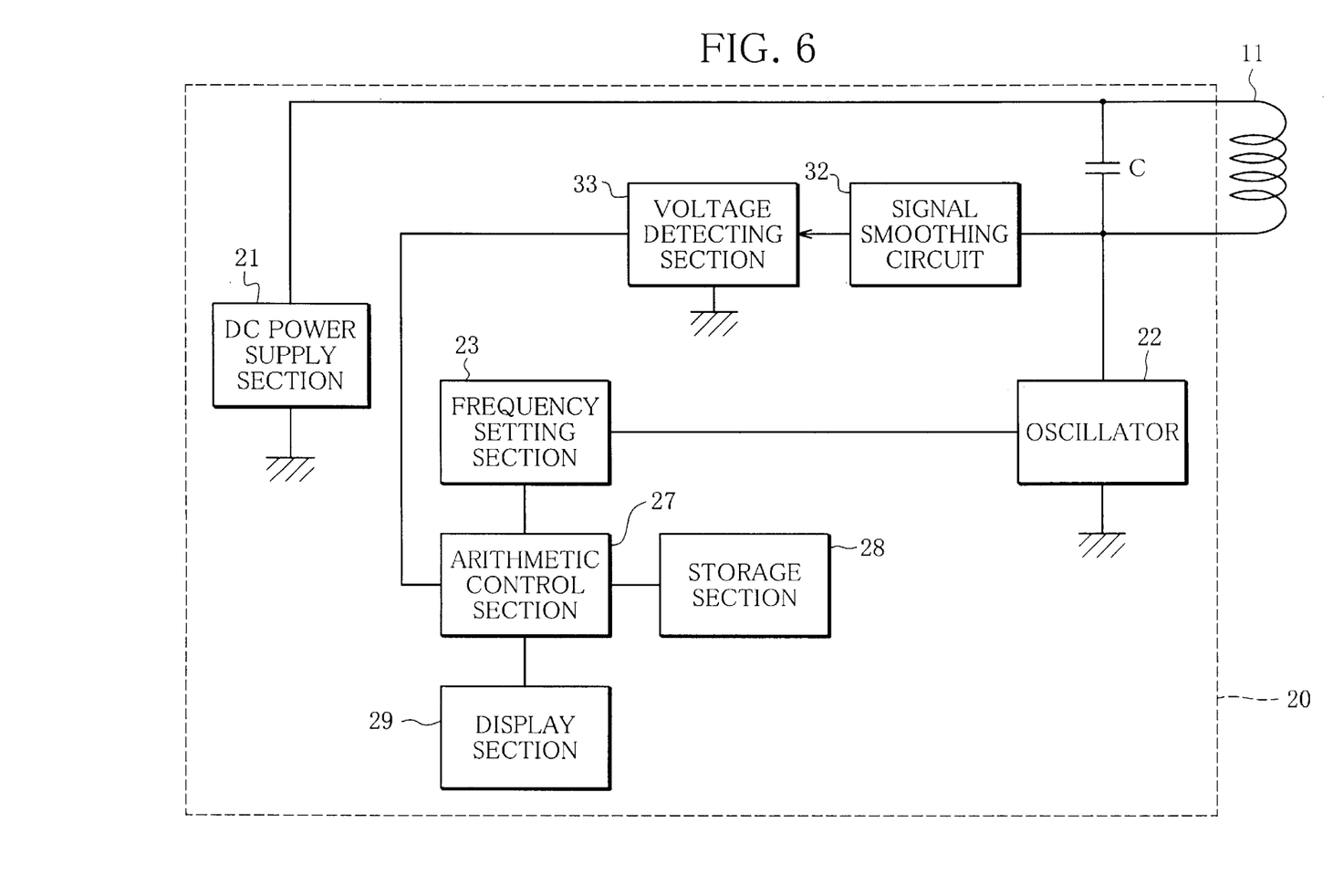
FIG. 6 is a block circuit diagram of an abnormality diagnosis apparatus according to a third embodiment of the present invention.

With reference to FIG. 6, an abnormality diagnosis apparatus according to a third embodiment will be described.

In FIG. 6, those components of the diagnosis apparatus 20 of this embodiment which are common to the second embodiment shown in FIG. 5 are denoted by the same reference numerals.

The diagnosis apparatus 20 of this embodiment is featured in that it achieves a reduction in costs and size by eliminating the first signal smoothing circuit 30 and first voltage detecting section 31 provided in the second embodiment, but is the same as the second embodiment in other respects.

In the diagnosis apparatus 20 of this embodiment, the arithmetic control section 27 operates basically in the same manner as in the second embodiment. Specifically, the arithmetic control section 27 detects voltage values of the mutual induction signal representing the magnitude of counter electromotive force generated between one end of the primary coil 11 and the earth so as to correspond to oscillation frequencies while varying the oscillation frequency of the oscillator 22 in a desired frequency region, determines the maximum voltage value of the mutual induction signal in the desired frequency region and a particular oscillation frequency corresponding thereto, and diagnoses the presence or absence of an abnormality in the secondary-side closed circuit of the separable transformer 1 by comparing the maximum voltage value and the particular oscillation frequency with the maximum voltage values and particular frequencies for the cases where the closed circuit is normal and has an abnormality.

With the third embodiment detecting the mutual induction signal for use in the abnormality determination for the secondary-side closed circuit without using two signal smoothing circuits and two voltage detecting sections, it is possible to reduce the manufacturing costs of and the installation space for the abnormality diagnosis apparatus and attain basically the same effects as those attained by the second embodiment.

In the second and third embodiments, the presence or absence of abnormality in the secondary-side closed circuit of the separable transformer may be determined with use of the diagnosis technique based on the threshold values or differential values of the output voltage of the signal smoothing circuit 25, which technique has been described in the first or second modification of the first embodiment.

The present invention is not limited to the first to third embodiments and modifications thereof, and can be modified variously without departing from the concept of the present invention.

For example, in the embodiments and modifications thereof, the cases where the load connected to the secondary coil of the separable transformer is constituted by a heating wire for an air bag device have been explained. Of course, however, the load for the separable transformer to which the present invention is applied is not restricted to such a heating wire.

In the embodiments and modifications thereof, the cases where the present invention is applied to the separable transformer constituting the rotary connector to be installed in the steering apparatus have been explained. However, the present invention is applicable to other types of separable transformer.

What is claimed is:

1. An abnormality diagnosis method for a separable transformer having primary and secondary coils thereof adapted to be electromagnetically coupled to each other and wound individually on primary and secondary cores that are arranged to face each other with a predetermined gap there_between for relative rotation, comprising the steps of:
   (a) measuring mutual induction signals each generated in the primary coil of the separable transformer when an ac signal having a corresponding one of different frequencies is applied to the primary coil;
   (b) determining a frequency characteristic of mutual induction signal based on the mutual induction signals measured individually at the different frequencies of the ac signal in the step (a); and
   (c) determining an occurrence of a short-circuit or wire breakage failure in a closed circuit including the secondary coil of the separable transformer and a load connected thereto, based on the frequency characteristic of mutual induction signal determined in the step (b).

2. The abnormality diagnosis method according to claim 1, wherein in said step (a), the mutual induction signals are measured while the frequency of the ac signal is varied.

3. The abnormality diagnosis method according to claim 1, wherein in said step (c), the short-circuit or wire breakage failure in the closed circuit is determined by comparing the frequency characteristic of mutual induction signal determined in step (b) with frequency characteristics of mutual induction signal that are determined in advance individually for a closed circuit which is normal in electric connection, a closed circuit having a wire breakage failure, and a closed circuit having a short-circuit failure.

4. The abnormality diagnosis method according to claim 1, further comprising the steps of:

(d) determining a maximum smoothed signal level and a particular ac signal frequency for a normal condition based on smoothed signals obtained by smoothing mutual induction signals successively generated in a primary coil of a testing separable transformer when ac signals having different frequencies are successively applied thereto, the testing separable transformer having the same construction as that of said separable transformer and having a secondary coil thereof connected to a load that cooperates therewith to constitute a closed circuit which is in a normal condition;

(e) determining a maximum smoothed signal level and a particular ac signal frequency for a wire breakage condition based on smoothed signals obtained by smoothing mutual induction signals successively generated in the primary coil of the testing separable transformer when ac signals having different frequencies are successively applied thereto, the secondary coil of the testing separable transformer being connected to a load that cooperates therewith to constitute a closed circuit which is in a wire breakage condition;

(f) determining a maximum smoothed signal level and a particular ac signal frequency for a short-circuit condition based on smoothed signals obtained by smoothing mutual induction signals successively generated in the primary coil of the testing separable transformer when ac signals having different frequencies are successively applied thereto, the secondary coil of the testing separable transformer being connected to a load that cooperates therewith to constitute a closed circuit which is in a short-circuit condition; and (g) determining in advance first, second and third threshold values at first, second and third predetermined ac signal frequencies corresponding individually to the particular ac signal frequencies for the normal, wire breakage and short-circuit conditions, based on the maximum smoothed signal levels and the particular ac signal frequencies for the normal, wire breakage and short-circuit conditions, wherein:

said step (a) includes successively measuring mutual induction signals generated when ac signals having the first, second and third predetermined ac signal frequencies are applied to the primary coil of the separable transformer, respectively;

said step (b) includes measuring signal levels of smoothed signals obtained by smoothing the mutual induction signals measured in said step (a); and said step (c) includes determining the short-circuit or wire breakage failure in the closed circuit by comparing the signal levels with the first, second and third threshold values, respectively.

5. The abnormality diagnosis method according to claim 1, further comprising the steps of:

(h) determining a particular ac signal frequency for a normal condition based on smoothed signals obtained by smoothing mutual induction signals successively generated in a primary coil of a testing separable transformer when ac signals having different frequencies are successively applied to the primary coil of the testing separable transformer having the same construction as that of said separable transformer and having a secondary coil thereof connected to a load that cooperates therewith to constitute a closed circuit which is in the normal condition; and (i) determining a particular ac signal frequency for a wire breakage or short circuit condition based on smoothed signals obtained by successively applying the ac signals to the primary coil of the testing separable transformer whose secondary coil is connected to a load that cooperates therewith to constitute a closed circuit having the wire breakage or short-circuit condition, wherein:

said step (a) includes successively measuring the mutual induction signals generated when the primary coil of said separable transformer is applied with an ac signal having a frequency thereof varying in a first frequency region including the particular frequency for the normal condition and in a second or third frequency region including the particular frequency for the wire breakage or short-circuit condition;

said step (b) includes sub-step (b11) of measuring signal levels of smoothed signals obtained by smoothing the mutual induction signals detected in said step (a), and sub-step (b12) of determining amounts of change in the smoothed signal level in the first frequency region and in the second or third frequency region; and said step (c) includes determining the short-circuit or wire breakage failure in the closed circuit based on the amounts of change in the smoothed signal level measured in said sub-step (b12).

6. An abnormality diagnosis apparatus for a separable transformer having primary and secondary coils thereof adapted to be electromagnetically coupled to each other and wound individually on primary and secondary cores that are arranged to face each other with a predetermined gap there between for relative rotation, comprising:

signal applying means for successively applying ac signals having different frequencies from each other to the primary coil of the separable transformer;

signal detecting means for detecting mutual induction signals each generated in the primary coil when a corresponding one of the ac signals is applied to the primary coil, thereby detecting the mutual induction signals;

frequency characteristic determining means for successively detecting frequencies of the ac signals and determining a frequency characteristic of mutual induction signal from the frequencies of the ac signals and the mutual induction signals detected by the signal detecting means; and abnormality determining means for successively detecting frequencies of the ac signals and for determining an occurrence of a short-circuit or wire breakage failure in a closed circuit including the secondary coil of the separable transformer and a load connected thereto, based on the frequency characteristic of mutual induction signal determined by the frequency characteristic determining means.

7. The abnormality diagnosis apparatus according to claim 6, wherein said signal applying means applies an ac signal to the primary coil while varying a frequency of the ac signal.

8. The abnormality diagnosis apparatus according to claim 6, wherein said abnormality determining means includes storage section for storing frequency characteristics of mutual induction signal for normal, wire breakage and short-circuit conditions that are determined beforehand for cases where the closed circuit is in normal, wire breakage and short-circuit conditions, said abnormality determining means determining the short-circuit or wire breakage failure in the closed circuit by comparing the frequency characteristic of mutual induction signal determined from the frequencies of the ac signals and the mutual induction signals with the frequency characteristics of mutual induction signal for the normal, wire breakage and short-circuit conditions.

9. The abnormality diagnosis apparatus according to claim 6, wherein said signal detecting means includes a smoothing circuit section for smoothing the mutual induction signals to obtain smoothed signals, and signal level detecting means for detecting signal levels of the smoothed signals, and said abnormality determining means includes a storage section for storing first, second and third threshold values at first, second and third predetermined ac signal frequencies determined from maximum smoothed signal levels and particular ac signal frequencies, which correspond thereto and to which the first, second and third predetermined ac signal frequencies correspond, obtained beforehand when the closed circuit is in normal, wire breakage, and short-circuit conditions, said abnormality determining means determining the short-circuit or wire breakage failure by comparing signal levels of smoothed signal detected by said signal level detecting section at the first, second and third predetermined ac signal frequencies with the first, second and third threshold values, respectively.

10. The abnormality diagnosis apparatus according to claim 6, wherein said signal detecting means includes a smoothing circuit section for smoothing the mutual induction signals to thereby obtain smoothed signals, and signal level detecting means for detecting signal levels of the smoothed signals, and said abnormality determining means determines amounts of change in smoothed signal level caused with changes in ac signal frequency in a first frequency region and in a second or third frequency region, from the smoothed signal levels detected by said signal level detecting section in the first frequency region and in the second or third frequency region, and determines the short-circuit or wire breakage failure in the closed circuit based on the amounts of change in smoothed signal level, said first frequency region and said second or third frequency region including particular ac signal frequencies corresponding to maximum smoothed signal levels observed when the closed circuit is normal in electric connection and when it has the wire breakage or short-circuit failure, respectively.

11. The abnormality diagnosis apparatus according to claim 9 or 10, wherein said signal detecting means includes a differential amplifier having an input side thereof connected to opposite ends of the primary coil and an output side thereof connected to said smoothing circuit section.

12. The abnormality diagnosis apparatus according to claim 9 or 10, wherein said smoothing circuit section of said signal detecting means includes a first smoothing circuit thereof connected to one end of the primary coil and a second smoothing circuit thereof connected to another end of the primary coil, and said signal level detecting section of said signal detecting means includes first and second voltage detecting sections thereof connected to said first and second smoothing circuits, respectively.

13. The abnormality diagnosis apparatus according to claim 9 or 10, wherein said smoothing circuit section of said signal detecting means is comprised of a smoothing circuit connected to one end of the primary coil, and said signal level detecting section of said signal detecting means is comprised of a voltage detecting section connected to said smoothing circuit.

14. The abnormality diagnosis apparatus according to claim 6, wherein said diagnosis apparatus is mounted to a separable transformer whose primary and secondary cores are mounted to a stator and a rotor fixed to stationary and rotary members of a steering apparatus, respectively, said diagnosis apparatus being attached to the stator.

15. The abnormality diagnosis apparatus according to claim 14, wherein said load is a heating wire for an airbag device accommodated in the steering apparatus.

* * * * *